United States Patent
Machida

[19]

[11] Patent Number: 6,038,387
[45] Date of Patent: Mar. 14, 2000

[54] METHOD FOR OPTICAL DESIGN OF LIGHTING EQUIPMENT UTILIZING LIGHT-EMITTING DEVICES

[75] Inventor: Tsutomu Machida, Shizuoka, Japan

[73] Assignee: Koito Manufacturing Co., Ltd., Tokyo, Japan

[21] Appl. No.: 08/858,635

[22] Filed: May 19, 1997

Related U.S. Application Data

[63] Continuation of application No. 08/388,305, Feb. 14, 1995, abandoned.

[30] Foreign Application Priority Data

Feb. 15, 1994 [JP] Japan .................................. 6-039273

[51] Int. Cl.$^7$ ........................... G06F 17/50; H01L 33/00; B60Q 1/44
[52] U.S. Cl. ................ 395/500.23; 395/500.01; 362/522; 362/309; 362/338; 362/545; 362/516; 356/124; 356/139.04; 359/727; 359/742
[58] Field of Search ....................... 395/500.34, 500.01, 395/500.23; 702/182; 362/487, 522, 520, 516, 509, 543–545, 308, 309, 335, 338; 356/139.04, 121–123, 138; 359/726, 727, 729–731, 741, 742; 313/110

[56] References Cited

U.S. PATENT DOCUMENTS

| 4,862,330 | 8/1989 | Machida et al. ........................ 362/61 |
| 4,951,179 | 8/1990 | Machida ................................. 362/61 |

FOREIGN PATENT DOCUMENTS 0495685  7/1992  European Pat. Off. .......... B60Q 1/30

OTHER PUBLICATIONS

Mark Hodapp, *Backlighting Automotive Telltales with LED Indicators*, SAE Technical Paper Series, Feb. 26–Mar. 2, 1990.

Mark Hodapp, *Using LED Indicators for Automotive Telltales* pp. 33–40.

*Primary Examiner*—Tariq R. Hafiz
*Assistant Examiner*—Tuan Q. Dam
*Attorney, Agent, or Firm*—Sughrue, Mion, Zinn, Macpeak & Seas, PLLC

[57] ABSTRACT

A method for precise design of light distribution for lighting equipment that use light-emitting devices, and for subsequently producing such equipment. By modeling the internal structure of an LED device with respect to the geometry and characteristics of a chip portion, chip reflector and lens portion, illuminating light from an LED device is classified into direct light from the chip portion and the reflected light from the chip reflector. The unknown values necessary for the modeling are specified preliminarily by actual measurements. Subsequently, the original geometry of the lens step is determined roughly based on the target direction and the diffusion angle of the light transmitted through the step. The manner in which the direct light from the chip portion and the reflected light from the chip reflector are transmitted through the lens portion and the lens step is simulated by ray tracing. In addition, the distribution of light is determined and evaluated for its compliance with a desired distribution. If necessary, the geometry of the lens step is modified in accordance with the results of the simulation and the evaluation of light distribution.

11 Claims, 7 Drawing Sheets

METHOD FOR OPTICAL DESIGN OF LIGHTING EQUIPMENT UTILIZING LIGHT-EMITTING DEVICES

This is a Continuation of Application Ser. No. 08/388,305 filed Feb. 14, 1995 now abandoned.

BACKGROUND OF THE INVENTION

The present invention relates to a method for optical design capable of effecting precise design in light distribution for lighting equipment that uses light-emitting devices.

Featuring higher luminous flux, recently developed LEDs (light-emitting diodes) are advantageous in many applications over incandescent electric bulbs for various reasons such as long life, small power consumption and low heat generation, and hence LEDs are used in a variety of lighting device for both indoor and outdoor applications. Exemplary applications of LED lamps in automotive lighting equipment include high-mount stop lamps and rearside marker lamps that are provided for ensuring against rear-end collisions by following cars.

FIG. 10 is a vertical section showing schematically the structural layout of a high-mount stop lamp. The high-mount stop lamp indicated by a has a lens body b with a cavity. The opening in the lens body b is closed with a cover member c to form a lighting space d, which contains a substrate f with a transverse array of LEDs e (only one of which is shown in FIG. 10).

One of the inner surfaces of the lens body b which faces the LEDs e is provided with lens steps g for controlling the direction of emission of the rays of light emitted from the LEDs (only one of which is shown in FIG. 10). The lens steps are designed optically so that the distribution of light from the lamp will comply with specified standards.

When designing the distribution of light from the lighting equipment described above, the chip portion h (see FIG. 10), which is the actual source of light for LEDs e, is taken substantially as a point source of light. To design the lamp using such LEDs, ray tracing is performed on the light issuing from each LED e. The distribution of light is then generally controlled by designing the geometry of individual lens steps g.

It should be particularly mentioned that the conventional methods of optical design take the internal structure of LEDs into consideration and that only the light that issues from the LEDs is measured for analysis; as a result of which, it is difficult to perform detailed design on the distribution of light without causing waste in the quantity of light.

FIG. 11(a) shows the construction of an individual LED e. As shown, the LED e has the chip portion h in its interior, and this chip portion h is protected by a resinous lens portion i. The chip portion h is mounted in the recess k of either one of lead frames j and j' (j in the case shown in FIG. 11(a)) and the inner peripheral surface of the cavity k serves to reflect the light from the chip portion h.

The chip potion h is not negligibly smaller in size than the cavity k and the lens portion i, and hence it is difficult to insure that the effects of the geometry of the chip portion h and the reflected light from the inner peripheral surface of the cavity k in the lead frame j are dealt with precisely in a simulation of the distribution of light.

In addition, the luminous intensity distribution of each LED e is generally symmetric with respect to the optical axis, and hence the conventional methods of optical design which employ a spherical lens or a fish-eye lens step present considerable difficulties in ensuring that a luminous intensity distribution having no rotational symmetry is provided with high precision.

FIG. 11(b) is a schematic representation of luminous intensity distribution in terms of an isocandela curve drawn on a coordinate system along three axes, A—A and B—B (positional coordinate axes that are perpendicular to the optical axis of LED and which cross each other at right angles) and CD (a luminous intensity axis that crosses A—A and B—B, at right angles). As shown, the luminous intensity distribution of each LED resembles a cone, with the luminous intensity being high in the central area close to the optical axis and decreasing progressively toward the periphery away from the optical axis.

FIGS. 12 and 13 show two luminous intensity distributions for conventional lighting equipment using an LED as described above. FIG. 12 shows the relationship between the illumination angle of a light distribution pattern along the vertical line (as plotted on the vertical axis, with "UP" referring to upward and "DW" downward) and luminous intensity (as plotted on the horizontal axis CD). FIG. 13 shows the relationship between the illumination angle of a light distribution pattern along the horizontal line (as plotted on the horizontal axis, with "RH" referring to rightward and "LF" leftward) and luminous intensity (as plotted on the vertical axis CD). In the graphs, the curves indicated by solid lines show the luminous intensity distribution characteristics, whereas those indicated by one-long-and-one-short dashed lines show the characteristics specified by relevant standards.

As shown in FIGS. 12 and 13, the conventional rough method of optical design lets the luminous intensity distribution of an LED device be reflected as such in the luminous intensity distribution of the final light distribution pattern, and hence the luminous intensity is high in areas near the horizontal or vertical line and tends to decrease toward the peripheral areas. Consequently, the luminous intensity in the hatched regions exceed the specified values, causing waste in the quantity of light.

Thus, there are limits on the precision of estimation of the distribution of light from lens steps if the internal structure of a light-emitting device is not taken into account.

SUMMARY OF THE INVENTION

To solve the aforementioned problems of the prior art, the present invention provides a method for optical design of lighting apparatus having a light-emitting device and a lens step positioned forward of the light-emitting device in such a manner that the results of simulation of the distribution of light that issues from said light-emitting device to be transmitted through the lens step are fed back for use in designing the geometry of the lens step, which method comprises the following steps:

(A) modeling the internal structure of the light-emitting device with respect to the geometry and characteristics of at least one of a chip portion, a reflecting portion provided around the chip portion and a lens portion protecting the chip portion, whereby the illuminating light from the light-emitting device is classified into direct light from the chip portion and reflected light from the reflecting portion provided around the chip portion, and, at the same time, the unknown constants necessary for the modeling are specified preliminarily by actual measurements;

(B) determining the original geometry of the lens step on the basis of the target direction and diffusion angle of the transmitted light;

(C) tracing the rays of light that is emitted from within the light-emitting device to be transmitted through the lens portion thereof and the lens step, in that order, and modifying the geometry of the lens step in accordance with the result of ray tracing;

(D) determining the distribution of light, evaluating the determined distribution to see whether it is a desired one or not, and modifying the geometry of the lens step in accordance with the result of that evaluation; and (E) repeating steps (C) and (D) until the desired distribution of light is obtained.

According to the present invention, the internal structure of a light-emitting device of interest is modeled on the basis of actual measurements, whereby the illuminating light from the light-emitting device is classified into direct light and reflected light; the results of ray tracing on these two kinds of light and simulation of the distribution of light are reflected in the design of the geometry of the lens step, thereby assuring close control on the distribution of light that is to be produced.

Hence, if one wants to produce a light distribution having no rotational symmetry using a light-emitting device such as an LED that has a luminous intensity distribution that is generally symmetric with respect to the optical axis, the desired distribution of light can be obtained by making efficient use of the light issuing from the light-emitting device.

DESCRIPTION OF THE PREFERRED EMBODIMENTS

The method of optical design of lighting equipment using a light-emitting device according to the present invention will now be described with reference to FIGS. 1 to 9.

In the present invention, internal structural features of an LED device, namely, the geometry of the chip portion, as well as the characteristics and geometries of a reflector mirror formed by the cavity in a lead frame (which is hereunder referred to as a "chip reflector") and a resinous lens portion protecting the chip portion, are taken into consideration for modeling these elements and, at the same time, an estimated distribution of light is provided on the basis of a model supported by actual measurements, whereby the precision of control over light distribution is improved.

Figure 1:
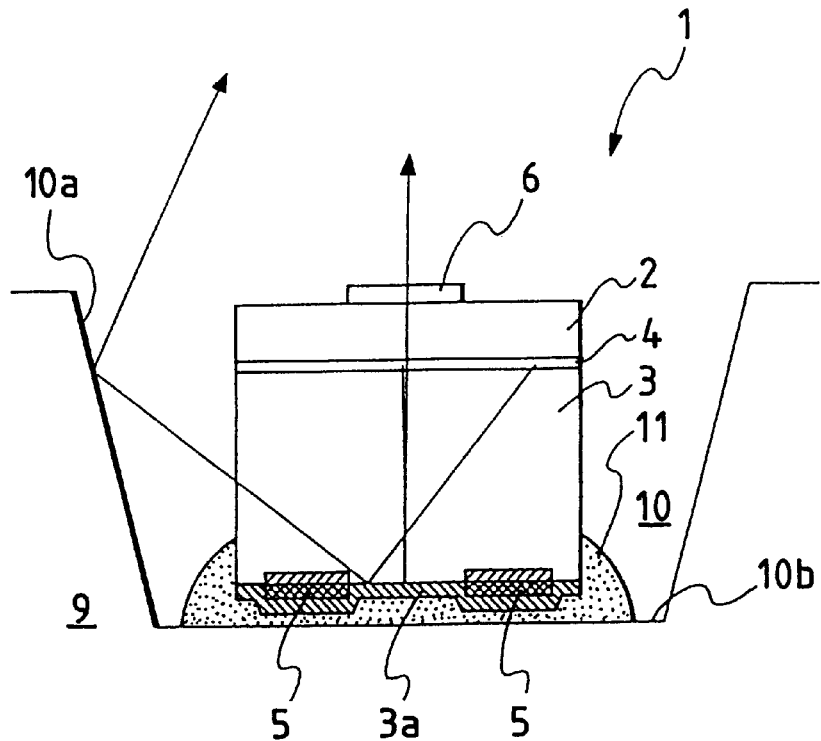
FIG. 1 is a schematic diagram showing an essential part of the configuration of an LED device.
Figure 2:
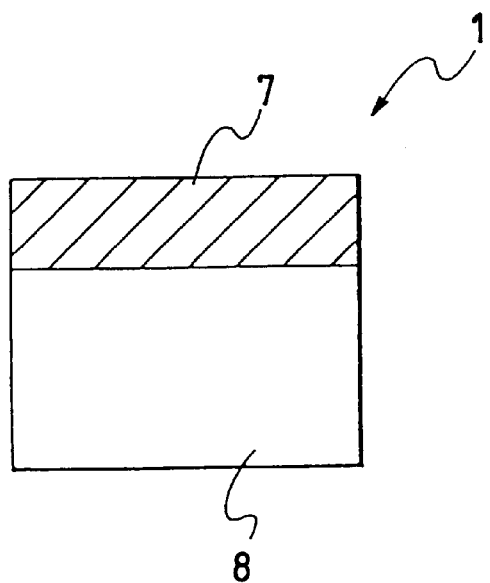
FIG. 2 is an illustration showing modeling of a chip portion of the LED device.

The chip portion is made of a known material such as Ga—Al—As or In—Ga—Al—P system, and may have a double hetero-junction, as shown in FIG. 1, in which the chip portion 1 is composed of an n-type cladding layer 2 and a p-type cladding layer 3 between which a light-emitting layer 4 is formed.

One end face 3a of the p-type cladding layer 3 serves as a die-bonding surface, on which ohmic contact electrodes 5 are formed of a gold-based material. Shown by 6 is a gold-based electrode for wire bonding and which is formed in a selected area of an end face of the n-type cladding layer 2.

For modeling, the chip portion 1 may be classified according to either the geometry or the luminance distribution of the light-emitting face. In the former case, the structure of the chip is a predominant factor and, in the latter case, the characteristics of the materials of the chip are predominate. Consider, for example, the case of dividing the chip portion into two parts, a bright part 7 including the light-emitting layer 4 and a dark part 8 (see FIG. 2); the chip portion 1 can be classified in several types by certain criteria such as whether the material of the dark part 8 is transparent to light or entirely light-opaque.

Such modeling of the chip portion 1 is a prerequisite for analysis of the direct light emitted therefrom. Another factor that must be taken into consideration is the effect of reflected light from the chip reflector.

Shown at 9 in FIG. 1 is a lead frame with a cavity 10 in which the chip portion 1 is fixed by die bonding with silver paste 11. The inner surfaces 10a of the cavity 10 act as the reflecting faces of the chip reflector. FIG. 1 shows the case where the chip portion 1 is mounted on the flat surface 10b of a cavity 10, which is inclined at a predetermined angle with respect to the inner surfaces 10a.

The intensity of reflection from the chip reflector can be modeled by the following equation:

$$I = I_0 \cdot \{R \cdot \cos^m \theta + (1-R) \cdot \cos \phi\} \quad (1)$$

The symbols in equation (1) are defined in Table 1 below.

TABLE 1

| Symbol | Definition |
|--------|------------|
| I | intensity of reflected rays |
| $I_0$ | intensity of incident rays |
| R | regular reflection coefficient |

TABLE 1-continued

| Symbol | Definition |
|---|---|
| m | directional diffuse reflection coefficient |
| θ | angle a reflected ray forms with the direction of regular reflection |
| φ | angle a reflected ray forms with a normal to the reflecting face |

The first term on the right side of equation (1) represents the intensity of a directional reflected component, and the second term denotes the intensity of a fully diffuse reflected component.

Figure 3:
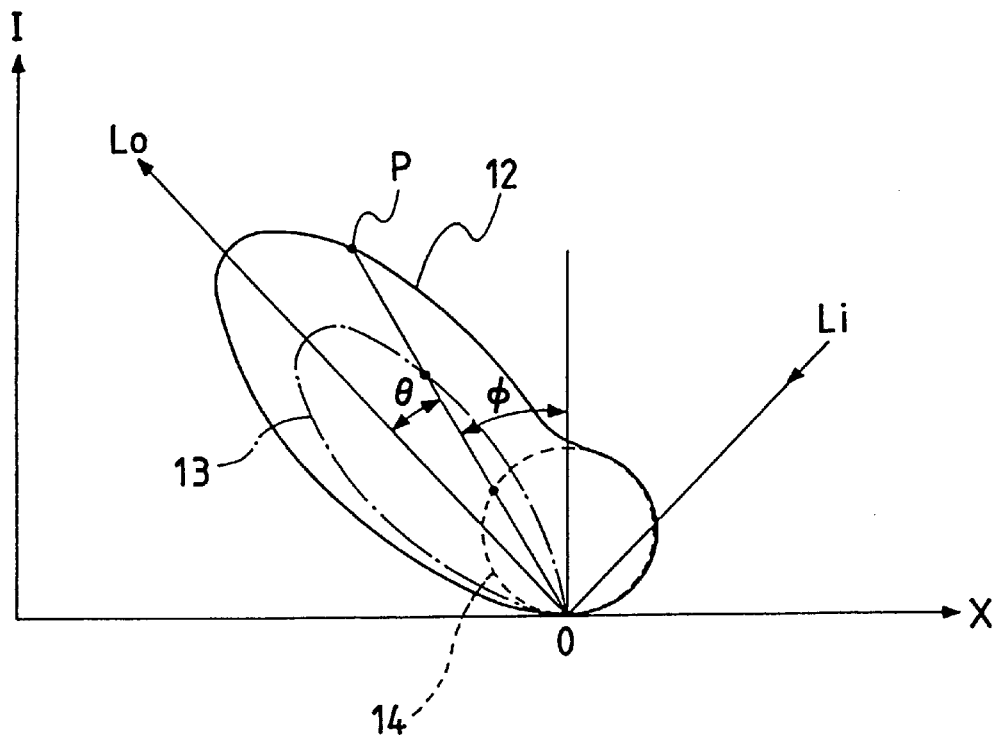
FIG. 3 is a graph for illustrating modeling of a chip reflector.

FIG. 3 is a graphic representation of equation (1) for illustrating the intensity distribution of reflected light. The horizontal axis of the graph is a position coordinate X fixed on the inner surface 10a of the cavity 10, the origin O is set at a particular point on that inner surface 10a, and the intensity of light I that issues from the chip portion 1 and which is reflected at the origin O is plotted on the vertical axis.

In FIG. 3, a half line $L_i$ which passes through the origin O and which slopes upward to the right indicates the direction of the incident ray whereas half line $L_O$ which also passes through the origin O but which slopes upward to the left indicates the direction of the reflected ray. Curve 12 indicated by a solid line represents the intensity distribution of the reflected ray. When point P is taken on the curve 12, the segment of a line OP forms angle θ with the half line $L_O$ and angle φ with a line parallel to the vertical axis (a line normal to the reflecting face is parallel to the vertical axis of the graph).

Curve 13 (indicated by an alternating long and short dashed line) which extends like a lobe along the half line $L_O$ represents the intensity distribution of the directional reflected component and a circle 14 (indicated by a dashed line) having a center on a line that passes through the origin O and which is parallel to the vertical axis and which also passes through the origin O represents the intensity distribution of the fully diffuse reflected component. The curve 12 is constructed by synthesizing the two curves 13 and 14. Hence, the intensity of the reflected ray at point P on curve 12 is equal to the sum of the intensities at the points where line segment OP intersect curves 13 and 14.

The unknowns in equation (1) are R and m, which are determined by actual measurements. Stated more specifically, these unknowns can be determined by a statistic technique based on measured values obtained with a plurality of LED devices.

The direct light from the chip portion 1 and the reflected light from the chip reflector pass through the formed lens portion before passing outside for illumination, and hence it is necessary to know the refractive index of the resin and the geometry of the interface at which refraction occurs.

Figure 4:
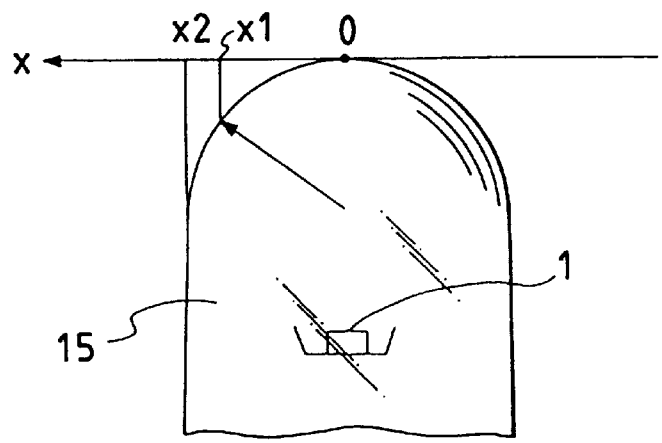
FIG. 4 is a diagram for illustrating the geometry of a lens portion.

FIG. 4 shows schematically the geometry of the lens portion 15. If the origin O is taken at the point of intersection between the optical axis of the LED device and the interface of refraction, when an axis that crosses the optical axis at right angles is set as the x-axis, the paraxial region of the refractive interface defined by x<x is spherical, and hence may be regarded as being spherical by rough approximation. In contrast, the peripheral region defined by $x_1$<x<$x_2$ is generally aspheric. Therefore, using the correct geometric data for this aspheric region, one can perform more precise analysis to realize a simulation of light distribution that is faithful to the actual phenomena.

Following the above-described modeling of the internal structure of a particular LED device, one can perform designing of the actual lens steps. In order to assure that the luminous intensity distribution of the LED device that is generally symmetric with respect to the optical axis (rotational symmetry) complies with the luminous intensity distribution of the light distribution pattern specified by relevant standards, an optical design technique for aspheric surfaces is basically required in designing the geometry of lens steps. In general, the greater the number of lens steps that face one LED device, the smaller the quantity of wasted light.

Figure 5:
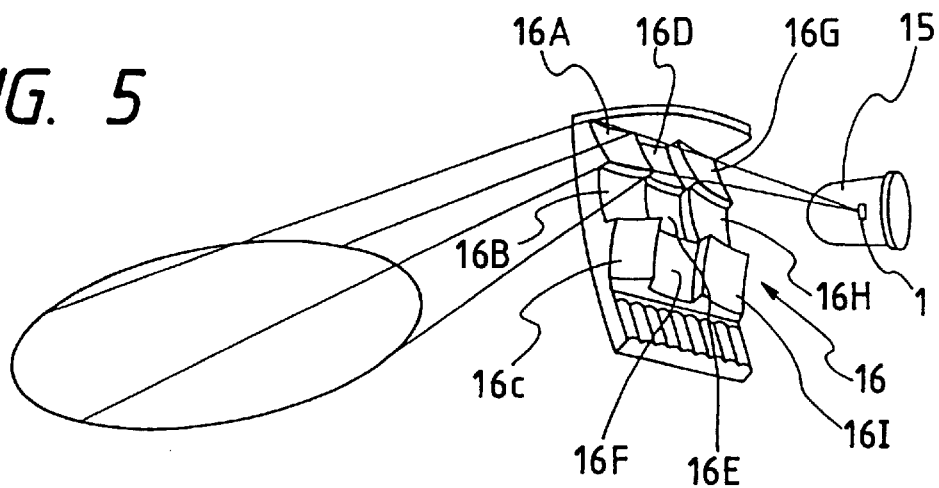
FIG. 5 is a perspective view showing the composition of a lens step.

FIG. 5 shows the case of providing a set of nine lens steps for one LED device. Lens steps, generally indicated at 16, are composed of nine segments 16A to 16I which allow transmitted light to target in different directions.

Figure 6:
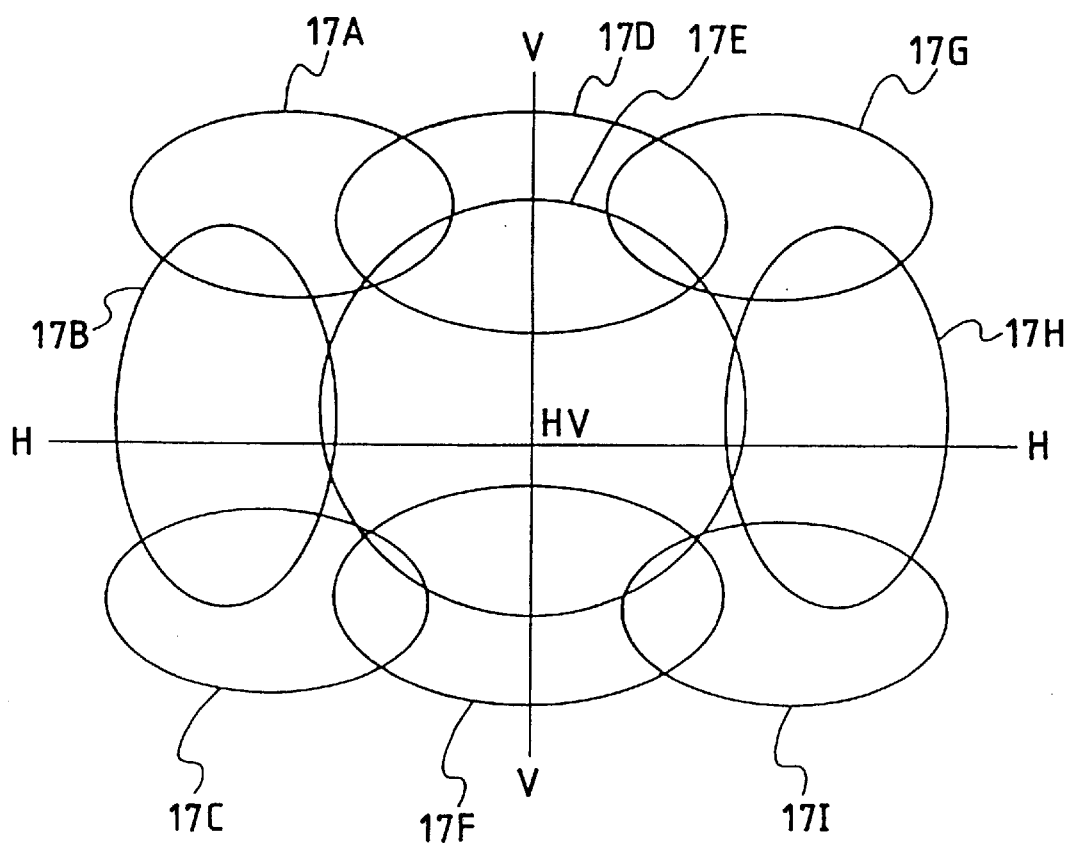
FIG. 6 is a diagram showing schematically the pattern of illumination from each of the segments that compose the lens step.

FIG. 6 shows diagrammatically how patterns 17A to 17I of the respective segments 16A to 16I are projected onto a screen distant from the lens step 16; line H—H is the horizontal line and line V—V is the vertical line, with the point of intersection HV coinciding with the point at which an extension of the optical axis of the LED device crosses the screen surface.

As seen generally, pattern 17E of segment 16E is located in the center and is surrounded by the patterns of the other segments. At the stage of designing the geometries of these segments, ray tracing by segment is performed regarding the illuminating light from the LED device that has been modeled for its internal structure by the procedure already described hereinabove, and a simulation of the distribution of light is performed on the basis of the results of this ray tracing.

Figure 7:
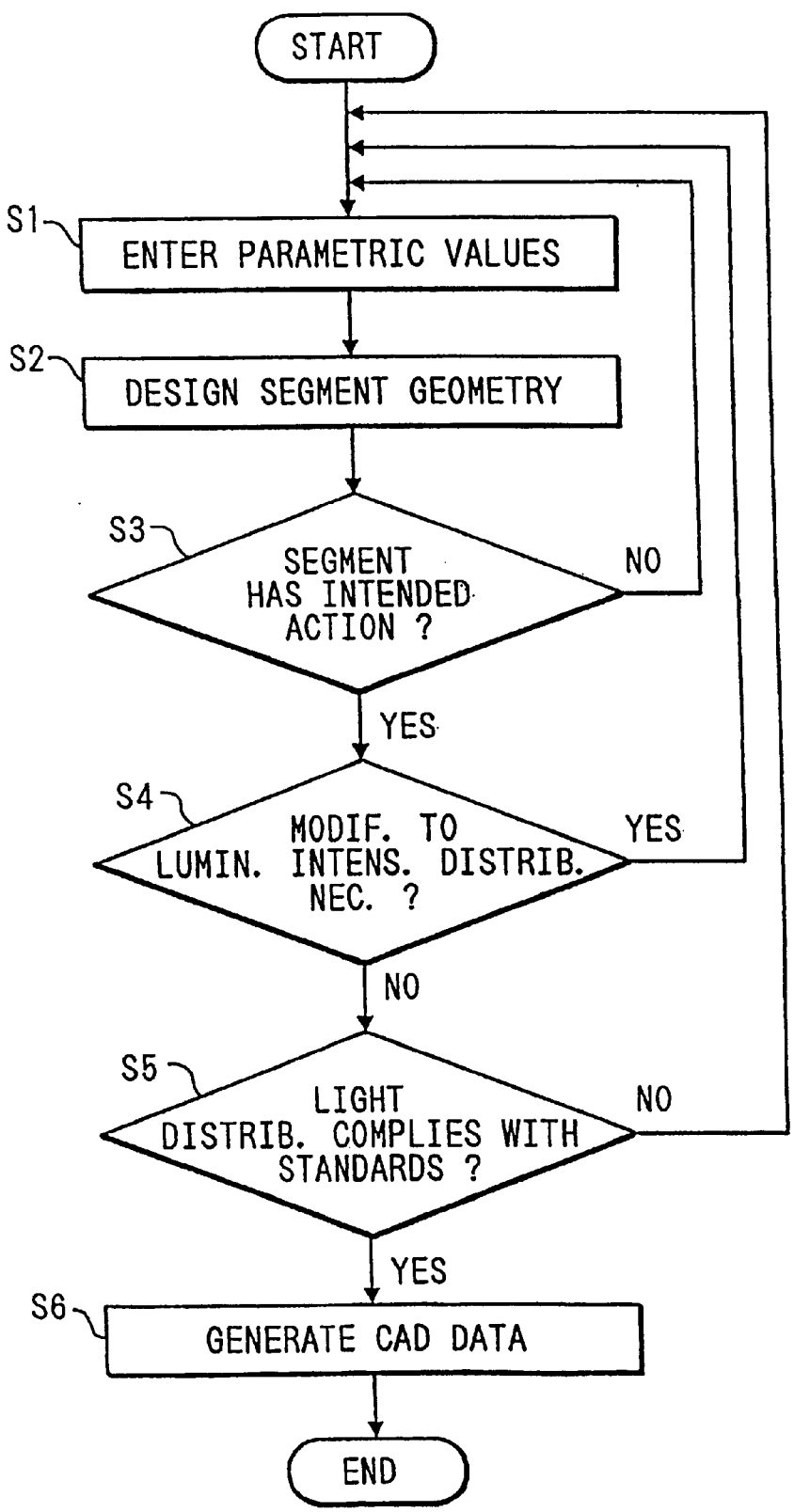
FIG. 7 is a flowchart showing the sequence of lens step design.

FIG. 7 shows the sequence of designing the lens steps 16 with software incorporated in a CAD (computer-aided design) system. In the first step S1, parametric values concerning segments are entered. Stated more specifically, the target direction and the diffusion angle of transmitted light from a segment are designated roughly. In the next step S2, the geometry of the segment is designed with the CAD system in such a way that the above-mentioned design requirements are satisfied. In step S3, ray tracing is performed to check to see if the segment has the intended optical action; if a modification is necessary, the process returns to step S1. In step 4, the luminous intensity distribution of the segment is evaluated; if a modification is necessary, the process returns to step S1. The procedure consisting of steps S1 to S4 is followed for all segments of interest, and iterative trials enable the design process to proceed from the initial rough stage to details.

In step S5, the pattern of distribution of light from the lens step 16 is checked for compliance with relevant standards. Stated more specifically, the total sum of the isocandela curves for all segments of interest is determined and evaluated for their luminous intensity distribution; if the results are satisfactory, the process proceeds to step S6 and, if not, the process returns to step S1 and necessary modifications are made to the entered parametric values.

In step S6, the lens step surfaces are connected for all segments so as to generate data for CAM (computer-aided manufacturing), which is then sent to a processing unit.

Figure 8:
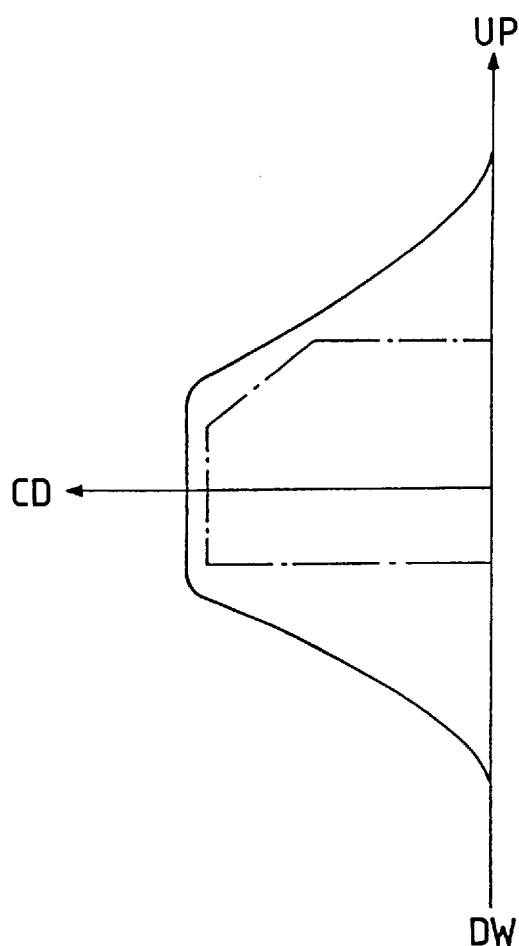
FIG. 8 is a diagram showing schematically the distribution of light from a high-mount stop lamp developed using the method of optical design according to the invention, showing particularly the luminous intensity distribution along the vertical line.
Figure 9:
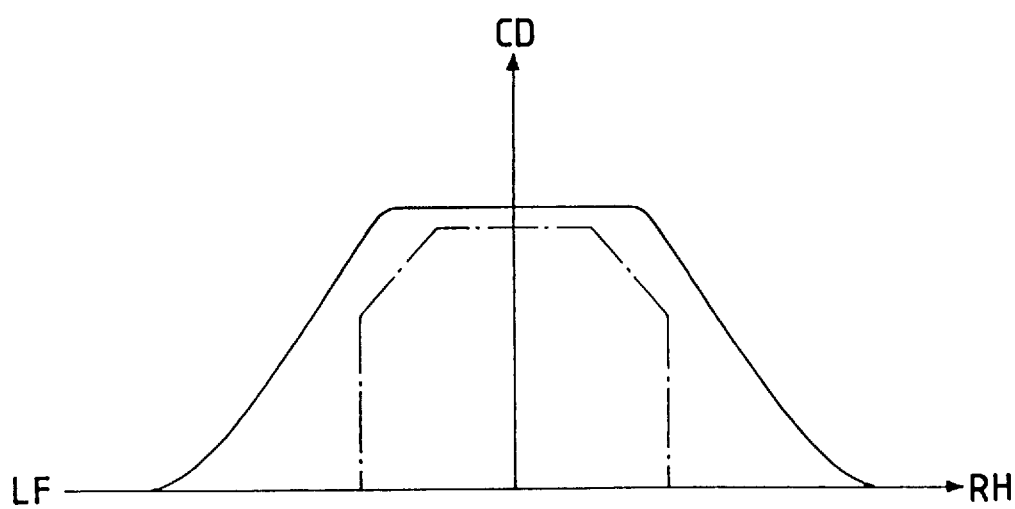
FIG. 9 is a diagram showing schematically the distribution of light from the same high-mount stop lamp, showing particularly the luminous intensity distribution along the horizontal line.
Figure 10:
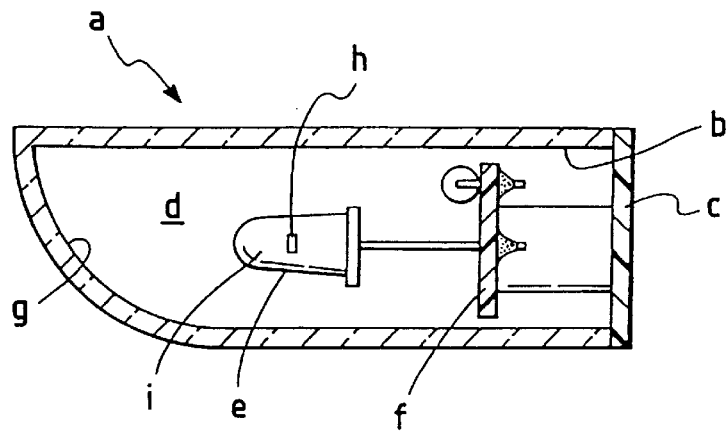
FIG. 10 is a longitudinal section showing schematically a structural layout of the high-mount stop lamp.
Figure 11A:
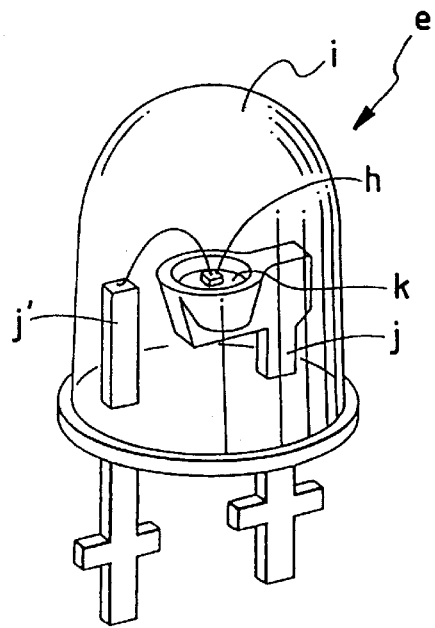
FIG. 11(a) is a perspective view showing schematically a structural layout of an LED device.
Figure 11B:
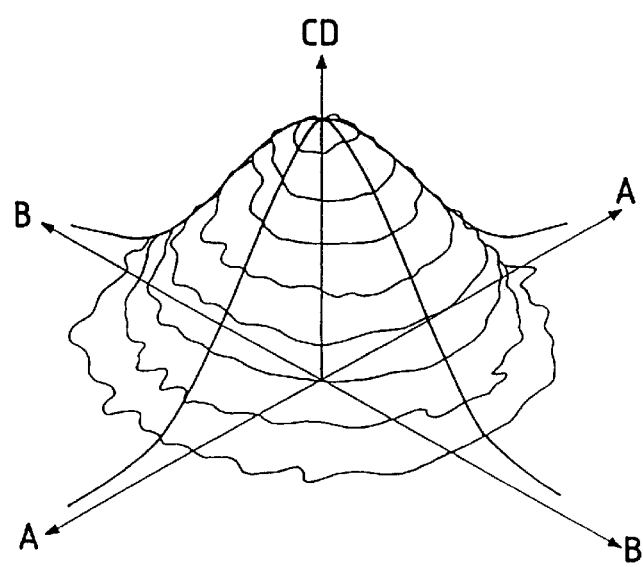
FIG. 11(b) is a diagram showing schematically the luminous intensity distribution of the LED device.
Figure 12:
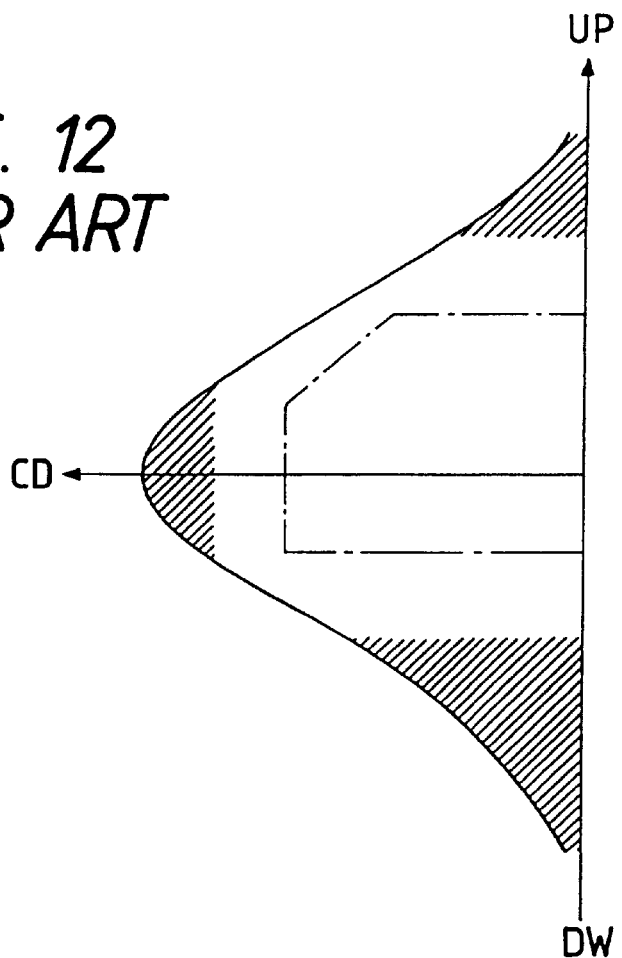
FIG. 12 is a diagram showing schematically the distribution of light from a prior art version of lighting equipment, particularly the luminous intensity distribution along a vertical line.
Figure 13:
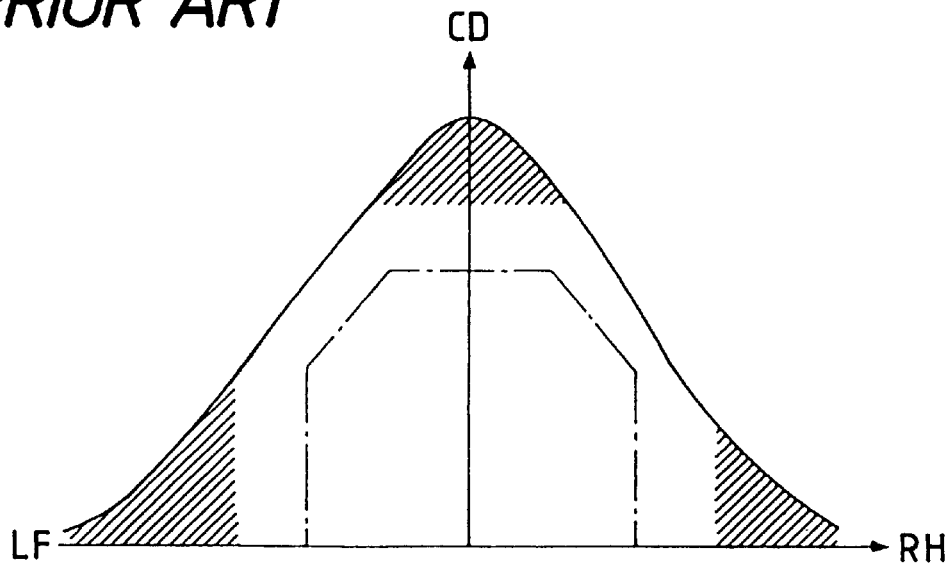
FIG. 13 is a diagram showing schematically the distribution of light from the same lighting equipment, particularly the luminous intensity distribution along a horizontal line.

FIGS. 8 and 9 show the luminous intensity distributions of a high-mount stop lamp designed by the process described above and as shown in FIG. 7. FIG. 8 shows the relationship between the illumination angle of a light distribution pattern along the vertical line (as plotted on the vertical axis, with "UP" referring to upward and "DOWN" downward) and luminous intensity (as plotted on the horizontal axis CD). FIG. 9 shows the relationship between the illumination angle of a light distribution pattern along the horizontal line (as plotted on the horizontal axis, with "RH" referring to rightward and "LF" leftward) and luminous intensity (as plotted on the vertical axis CD). In these graphs, the curves indicated by solid lines show the luminous intensity distribution characteristics, whereas those indicated by one-long-and-one-short dashed lines show the characteristics specified by relevant standards.

Obviously, all curves in FIGS. 8 and 9 are have flat portions in areas near the horizontal or vertical line, and the luminous intensity tends to attenuate sharply toward the peripheral areas. Therefore, the quantity of light from the LED device can be efficiently used to produce a light distribution pattern having a luminous intensity distribution close to that specified by relevant standards.

The foregoing description of the method of optical design may be summarized as follows.

(1) By modeling the internal structure of an LED device with respect to the geometry and characteristics of the chip portion 1, chip reflector (cavity 10) and lens portion 15, the illuminating light from the LED device is classified into direct light from the chip portion 1 and reflected light from the chip reflector. The unknown values necessary for modeling are specified preliminarily by actual measurements. As for the reflected light from the chip reflector, the intensity of reflection may be modeled by the equation for the addition of the intensity of the directional reflected component in the direction of reflection and that of the fully diffuse reflected component, thereby assuring precise estimation of light distribution.

(2) The original geometry of the lens step 16 is determined roughly based on the target direction and the diffusion angle of the light transmitted through the step.

(3) The manner in which the direct light issuing from the chip portion 1 of the LED device and the reflected light from the chip reflector are transmitted through the lens portion 15 and the lens step 16 is simulated by ray tracing; if necessary, the geometry of the lens step 16 is modified in accordance with the result of the simulation.

(4) The distribution of light is determined and evaluated for compliance with a desired distribution; if necessary, the geometry of the lens step 16 is modified in accordance with the result of the evaluation.

(5) The procedure of steps (3) and (4) is repeated until a satisfactory distribution of light is finally obtained.

The data obtained in the above manner are then applied to set the dimensions of a lens to be molded, which can be carried out using conventional techniques.

As will be clear from the foregoing description, the method of the invention includes a step of modeling the internal structure of a light-emitting device so that the illuminating light from the device is classified into direct light and reflected light. Then, ray tracing and simulation of light distribution are performed for these two kinds of light as they relate to the lens step, and the results of these operations are reflected in the design of the geometry of the lens step. Thus, close control can be effected over the distribution of light, and the quantity of light from the light-emitting device can be efficiently used to produce a desired light distribution pattern.

Hence, if one wants to produce a light distribution having no rotational symmetry using a light-emitting device such as an LED that has a luminous intensity distribution that is generally symmetrically with respect to the optical axis, the desired distribution of light can be obtained by making efficient use of the quantity of light issuing from the light-emitting device. As an added advantage, the lead time of development of lighting equipment can be shortened.

What is claimed is:

1. A method for optical design of lighting equipment having a light-emitting device and a lens step positioned forward of said light-emitting device in such a manner that results of simulation of the distribution of light that issues from said light-emitting device and is transmitted through the lens step are fed back for use in designing the geometry of the lens step, which method comprises the following steps:

(A) modeling an internal structure of the light-emitting device with respect to at least one of the geometry and characteristics of a chip portion, a reflecting portion provided around the chip portion, and a lens portion protecting the chip portion, whereby illuminating light from the light-emitting device is classified into direct light from the chip portion and reflected light from the reflecting portion provided around the chip portion, and conducting actual measurements to determine values of unknown values necessary for the modeling;

(B) determining an original geometry of the lens step on the basis of a target direction and diffusion angle of the transmitted light;

(C) tracing rays of light emitted from within the light-emitting device to be transmitted through the lens portion thereof and the lens step in the stated order, and modifying the geometry of the lens step in accordance with the result of ray tracing;

(D) determining the distribution of light, evaluating the determined distribution to see whether it is a desired distribution, and modifying the geometry of the lens step in accordance with the result of the evaluation; and (E) repeating steps (C) and (D) until a desired distribution of light is obtained.

2. The method according to claim 1, wherein, for reflected light obtained by classification in step (A), the intensity of reflection is modeled by an equation for the addition of the intensity of a directional reflected component in the direction of reflection and that of a fully diffuse reflected component.

3. The method according to claim 2, wherein said equation is:

$$I = I_0 \cdot \{R \cdot \cos^m \theta + (1-R) \cdot \cos \phi\}$$

where:

I: intensity of reflected rays, $I_0$: intensity of incident rays,

R: regular reflection coefficient, m: diffuse reflection coefficient,

θ: angle a reflected ray forms with a direction of regular reflection, and

φ: angle a reflected ray forms with a normal to a reflecting face.

4. A method for producing lighting equipment having a light-emitting device and a lens step positioned forward of said light-emitting device for transmitting light emitted by said light-emitting device, which method comprises the following steps:

(A) modeling an internal structure of the light-emitting device with respect to at least one of the geometry and characteristics of a chip portion, a reflecting portion provided around the chip portion, and a lens portion protecting the chip portion, whereby illuminating light from the light-emitting device is classified into direct light from the chip portion and reflected light from the reflecting portion provided around the chip portion, and conducting actual measurements to determine values of unknown values necessary for the modeling;

(B) determining an original geometry of the lens step on the basis of a target direction and diffusion angle of the transmitted light;

(C) tracing rays of light emitted from within the light-emitting device to be transmitted through the lens portion thereof and the lens step in the stated order, and modifying the geometry of the lens step in accordance with the result of ray tracing;

(D) determining the distribution of light, evaluating the determined distribution to see whether it is a desired distribution, and modifying the geometry of the lens step in accordance with the result of the evaluation;

(E) repeating steps (C) and (D) until a desired distribution of light is obtained; and (F) producing a lens having dimensions determined in accordance with data obtained in steps (A) to (E).

5. The method according to claim 4, wherein, for reflected light obtained by classification in step (A), the intensity of reflection is modeled by an equation for the addition of the intensity of a directional reflected component in the direction of reflection and that of a fully diffuse reflected component.

6. The method according to claim 5, wherein said equation is:

$$I = I_0 \cdot \{R \cdot \cos^m \theta + (1-R) \cdot \cos \phi\}$$

where:
I: intensity of reflected rays,
$I_0$: intensity of incident rays,
R: regular reflection coefficient,
m: diffuse reflection coefficient,
θ: angle a reflected ray forms with a direction of regular reflection, and
φ: angle a reflected ray forms with a normal to a reflecting face.

7. A method of optically designing an automotive lighting unit which comprises:
(1) a lens body having a plurality of lens steps and defining a cavity and an opening,
(2) a cover member disposed over said opening, and
(3) an integrated light emitting device disposed within said cavity and having at least:
    (i) a chip portion for emitting direct light,
    (ii) a light reflection portion, for reflecting said direct light and forming reflected light, and
    (iii) a protective lens portion for protecting said chip portion, said method being operative to optimize the transmission of the direct light and reflected light toward a target in a target direction, comprising;

(A) modeling the internal structure of said light emitting device with respect to at least one of the geometry and characteristics of (i) said chip portion, (ii) said light reflection portion and (iii) said protective lens portion by actually measuring at least regular and directional diffuse reflection coefficients;

(B) determining an initial geometry of one of said lens steps on the basis of the target direction and diffusion angle of said direct light and said reflected light;

(C) tracing rays of said direct light from a point within said light emitting device through said lens portion and said one lens step;

(D) initially modifying the geometry of said lens step in accordance with the result of ray tracing;

(E) determining the distribution of said direct and reflected light, and evaluating the determined distribution in order to determine whether it is a desired distribution:

(F) further modifying the geometry of said one lens step in accordance with the result of said evaluating step; and (G) repeating steps (C), (D), (E) and (F) until a desired distribution of light is obtained.

8. The method for optical design as set forth in claim 7 wherein said measurement of reflected light comprises measuring the intensity of a directional reflected component and the intensity of a fully diffuse reflected component.

9. The method according to claim 7 wherein, for reflected light obtained by classification in step (A), the intensity of reflection is modeled by an equation for the addition of the intensity of a directional reflected component in the direction of reflection and that of a fully diffuse reflected component.

10. The method according to claim 9, wherein said equation is $$I = I_0 \cdot \{R \cdot \cos^m \theta + (1-R) \cdot \cos \phi\}$$

where:
I: intensity of reflected rays,
$I_\theta$: intensity of incident rays,
R: regular reflection coefficient,
M: diffuse reflection coefficient
θ: the angle a reflected ray forms with a direction of regular reflection, and
φ: the angle a reflected ray forms with a normal to a reflecting face.

11. The method according to claim 7 wherein said steps B–G are applied individually to a plurality of said lens steps.

* * * * *